(12) United States Patent
Scanlan

(10) Patent No.: US 8,604,600 B2
(45) Date of Patent: Dec. 10, 2013

(54) FULLY MOLDED FAN-OUT

(75) Inventor: Christopher M. Scanlan, Chandler, AZ (US)

(73) Assignee: DECA Technologies Inc., Tempe, AZ (US)

( * ) Notice: Subject to any disclaimer, the term of this patent is extended or adjusted under 35 U.S.C. 154(b) by 32 days.

(21) Appl. No.: 13/341,654

(22) Filed: Dec. 30, 2011

(65) Prior Publication Data

US 2013/0168849 A1 Jul. 4, 2013

(51) Int. Cl.
*H01L 23/52* (2006.01)

(52) U.S. Cl.
USPC .......................................................... 257/690

(58) Field of Classification Search
USPC ............. 257/737, 787, 690, E23.069
See application file for complete search history.

(56) References Cited

U.S. PATENT DOCUMENTS

| | | | |
|---|---|---|---|
| 7,777,351 B1 * | 8/2010 | Berry et al. | 257/778 |
| 8,288,209 B1 | 10/2012 | Chi et al. | |
| 2003/0164554 A1 * | 9/2003 | Fee et al. | 257/787 |
| 2010/0195299 A1 | 8/2010 | Souriau et al. | |
| 2011/0042796 A1 * | 2/2011 | Chang et al. | 257/690 |
| 2011/0095413 A1 | 4/2011 | Barth et al. | |
| 2011/0186977 A1 * | 8/2011 | Chi et al. | 257/686 |
| 2012/0032314 A1 | 2/2012 | Chen et al. | |

* cited by examiner

*Primary Examiner* — Nikolay Yushin
(74) *Attorney, Agent, or Firm* — Booth Udall Fuller, PLC

(57) ABSTRACT

A method for manufacturing a device package may include constructing a spacer element coupled with a surface of a semiconductor die unit, where the spacer element is configured to create a gap between the semiconductor die unit and a surface of a carrier, and encapsulating the semiconductor die unit within a mold compound, where the encapsulating includes introducing the mold compound into the gap.

20 Claims, 10 Drawing Sheets

FULLY MOLDED FAN-OUT

TECHNICAL FIELD

This disclosure relates to the field of panelized packaging of semiconductor devices.

BACKGROUND

A common implementation of panelized packaging gaining acceptance in industry is fan-out wafer level packaging (WLP) in which multiple die units are placed face down on a temporary tape carrier. The multiple die units and temporary tape carrier are overmolded with a molding compound using a compression molding process. After molding the tape carrier is removed, leaving the active surface of the multiple die units exposed in a structure commonly referred to as a reconstituted wafer. Subsequently, a wafer level chip scale package (WLCSP) build-up structure is formed on top of the reconstituted wafer. Ball grid array (BGA) balls are attached to the reconstituted wafer and then the reconstituted wafer is saw singulated to form individual packages.

BRIEF DESCRIPTION OF THE DRAWINGS

The present disclosure is illustrated by way of example, and not by way of limitation, in the figures of the accompanying drawings.

DETAILED DESCRIPTION

Figure 1A:
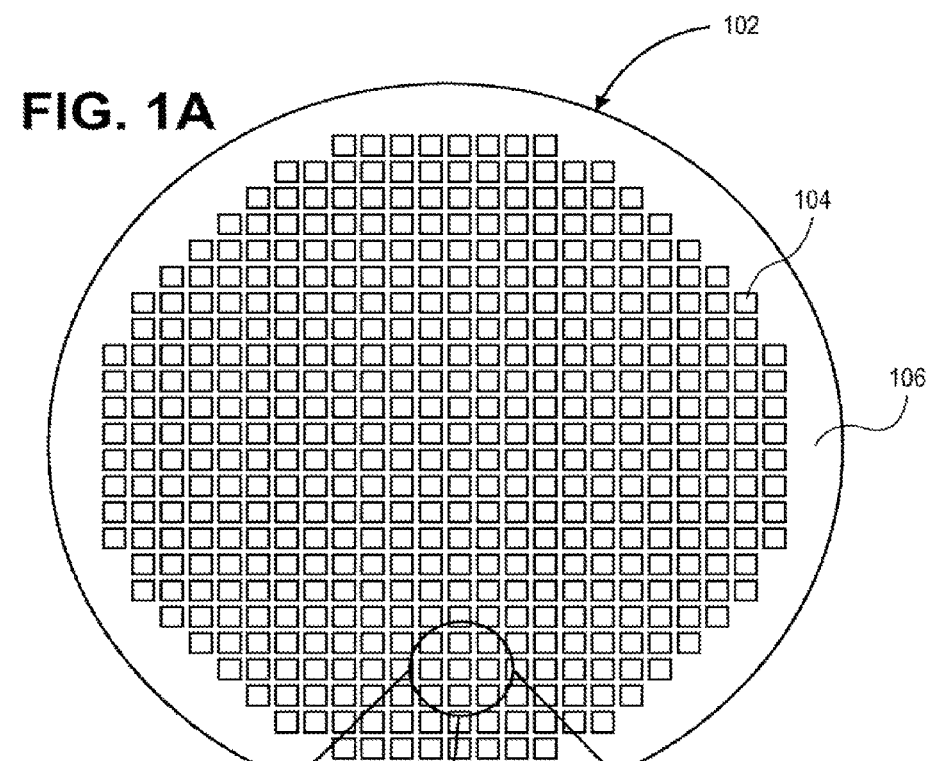
FIG. 1A illustrates an embodiment of a reconstituted wafer.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

The terms "over", "between" and "on" as used herein refer to a relative position of one layer with respect to other layers. One layer deposited or disposed over or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

The embodiments disclosed herein include methods and structures applicable to panelized packaging, such as fan-out WLCSP. In the following description, specific embodiments are described with regard to single die applications. Embodiments of the present invention may also be useful in multi-die modules or some combination of die and passive components (such as capacitor, inductor, or resistor) and/or other components (such as an optical element, connector, or other electronic component) within modules.

In one embodiment, a method for packaging a semiconductor device may include encapsulating the semiconductor die unit within a mold compound by surrounding all sides of the die unit with the mold compound. In one embodiment, the semiconductor die unit may be encapsulated such that all six sides of the die unit are covered with mold compound.

In one embodiment, this process may include creating a gap between the die unit and a carrier, such as a tape carrier, to allow mold compound to flow into the gap between the die unit and the carrier. In one embodiment, the gap may be created by constructing a spacer element on the die unit, then placing the die unit on the carrier so that the spacer separates the die unit from the surface of the carrier.

In one embodiment, the spacer element may also be used to electrically connect one or more bond pads of the die unit to an external surface of the semiconductor package. For example, the spacer element may include one or more conductive posts, which may be constructed from a material such as copper that is plated on the bond pads of the semiconductor die unit.

In one embodiment, a pad may be referred to herein as a "bond pad" whether or not any wire is bonded to the pad. The bond pad may thus be any point where an electrical connection can be made for supplying signals to or receiving signals from the circuits integrated within the die unit.

Thus, in one embodiment, the semiconductor die unit may be substantially encapsulated by the mold compound such that the majority of the die unit is surrounded by mold compound, with the possible exception of any conductive paths, such as conductive posts, between the die unit and the exterior of the package.

In one embodiment, a fan-in redistribution layer (RDL) structure may be constructed on the die unit, and spacer elements such as conductive posts may be constructed on the fan-in RDL structure. In one embodiment, a fan-in RDL may be used to move connection points in an X-Y plane so that the connection points are spaced closer to each other in the X-Y plane. In contrast, a fan-out RDL may be used to move connection points farther apart in the X-Y plane. Both types of RDL may establish the new connection points in a Z direction away from the original connection points, which may include bond pads of the die unit.

In one embodiment, the fan-in RDL structure may be applied to the native device wafer before dicing to separate the wafer into individual die units. In one embodiment, the fan-in RDL structure provides routing flexibility and mitigates the need for accurate die placement.

In one embodiment, after encapsulating the die unit and any fan-in RDL structure and conductive posts in the mold compound, a fan-out RDL structure may be built on the surface of the mold compound and may be electrically connected to the conductive posts. In one embodiment, the RDL may be applied to a molded wafer, which may include multiple die units encapsulated by a single mass of mold compound, before singulation of the individual die units.

In one embodiment, the process for manufacturing a fully molded package simplifies and reduces the cost for assembling a fan-out semiconductor package by eliminating panel post-processing that may be used in other fan-out WLP processes.

In one embodiment, the fully molded package lacks topographic discontinuities on the bottom surface of the package, at the edges of the semiconductor die unit. This may simplify the process for constructing a fan-out RDL structure on the bottom of the package.

Furthermore, the process may reduce warpage effects caused by uneven distribution of the mold compound such that procedures for controlling the warpage, such as grinding of the back of the panel, may be eliminated.

In an embodiment, a plurality of device units may be assembled and molded to create a panel, or reticulated wafer. Device units may be active device units such as dies, and may also be passive device units such as an integrated passive network, or a discrete passive device unit such as a capacitor, resistor, or inductor. The device units may be pre-packaged, though pre-packaging is not required. In accordance with embodiments of the present invention, the pre-packages may contain single or a plurality of device units and other components.

Embodiments described herein may be used in any panelized packaging application including single-die applications, multi-die modules, some combination of a die(s) and a passive component(s) within a module, or some combination of a device unit(s) and another component(s) within a module.

According to one implementation of fan-out wafer-level packaging (WLP), multiple die may be placed face down on a temporary tape carrier. The carrier may then be overmolded with epoxy molding compound using a compression molding process. After molding, the carrier tape may be removed, leaving the active surface of the die exposed.

FIG. 1A illustrates an embodiment of a panel 102 a panel 102 including a plurality of device units 104 overmolded with an encapsulating material 106 such as an epoxy resin. While FIG. 1A illustrates a circular panel 102, alternative panel formats such as rectangular or square may be utilized. As illustrated in FIG. 1A, the active surfaces of the plurality of device units 104 may be substantially flush with the encapsulating material 106. In an embodiment, panel 102 may be what is known in the art as a reconstituted wafer formed in a WLP technique where the plurality of device units are placed face down on a temporary tape carrier, followed by overmolding with epoxy molding compound using a compression molding process, followed by removal of the temporary tape carrier leaving the active surfaces of the plurality of die units exposed.

Figure 1B:
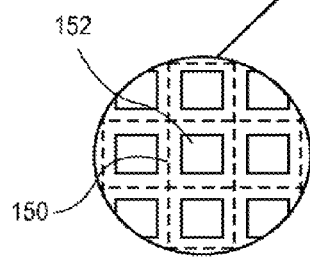
FIGS. 1B-1D illustrate top views of a plurality of packages or modules arranged in a reconstituted wafer, according to embodiments.
Figure 1C:
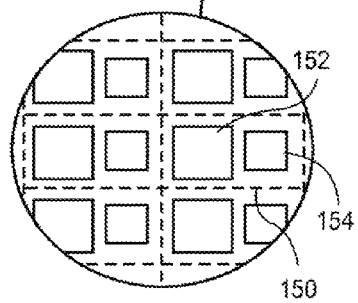
Figure 1D:
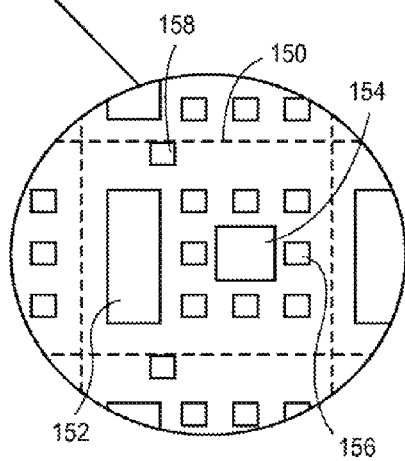

Subsequently, a build-up structure may be formed on top of the structure illustrated in FIG. 1A and the device units may be singulated to form packages or modules. For example, as illustrated in FIG. 1B, the panel may be singulated into a plurality of single-die packages 150, each package including a single semiconductor die unit 152. Referring to FIG. 1C, a plurality of die units 152, 154 may be mounted within the molded panel and singulated to form multi-die packages or modules 150. Referring to FIG. 1D, a single die unit 152 or a plurality of die units 152, 154 may be mounted within the molded panel with the addition of a passive device(s) 156 (such as capacitor, inductor or resistor) and/or other component(s) 158 (such as an optical element, connector or other electronic component) and singluated to form a packages or modules 150 which include both an active device(s) and a passive device(s) and/or other component 158. A variety of combinations of active and passive devices and optionally other components within packages or modules are envisioned in accordance with embodiments of the present invention. Accordingly, the particular configurations illustrated in FIGS. 1B-1D are meant to be illustrative rather than limiting.

Implementations of this process may result in packages having mold compound in contact with the back of the chips, but no material covering the front of the chips. As a result, extensive post processing may be used to mitigate panel warpage. This may include constraining the panel during post mold cure, or grinding to remove mold compound from the back of the chips after molding. According to one implementation, a laminated epoxy film may be applied over the back of the panel after first removing the mold compound from the back of the panel.

A package constructed in this manner may also have a topographical discontinuity where the edge of the chip meets the mold compound, which may be caused by the die being compressed into the tape during molding as well as mold flash. Thus, a process for constructing a redistribution layer (RDL) may need to be designed to accommodate this topographical discontinuity.

In one embodiment, an embodiment of a chip packaging process may address these issues by encapsulating all sides of the chip simultaneously during the molding of the panel, resulting in a similar thickness of mold compound above and below the chip. This provides a balanced structure with reduced warpage, such that subsequent grinding of the back of the wafer is not needed. In one embodiment, a fan-in RDL structure may be constructed on the native wafer, allowing for more flexible routing.

In one embodiment, a method for constructing a chip package may include constructing a spacer element attached to a surface of a semiconductor die unit, then placing the die unit on a carrier such that the spacer element creates a gap between the die unit and the carrier. In one embodiment, the carrier may be a tape carrier.

Following placement of the die unit on the carrier, a compression molding process may be used to introduce mold compound into the gap created by the spacer element between the die unit and the carrier surface. Mold compound may thus encapsulate all sides of the die unit, since space is available for filling on all sides of the die unit, including the side of the die unit facing the carrier.

A semiconductor device package manufacturing process that substantially encapsulates the die unit within the mold compound may further connect bond pads at an active surface of the die unit to conductive material at the exterior of the semiconductor device package. For example, the spacer element itself may be constructed from a conductive material such as copper that is plated onto the bond pads to or onto a fan-out RDL structure that is connected to the bond pads to create one or more conductive posts. In one embodiment, the conductive posts may be electrically connected to conductive material that is part of a fan-out RDL structure or solder balls.

Figure 2:
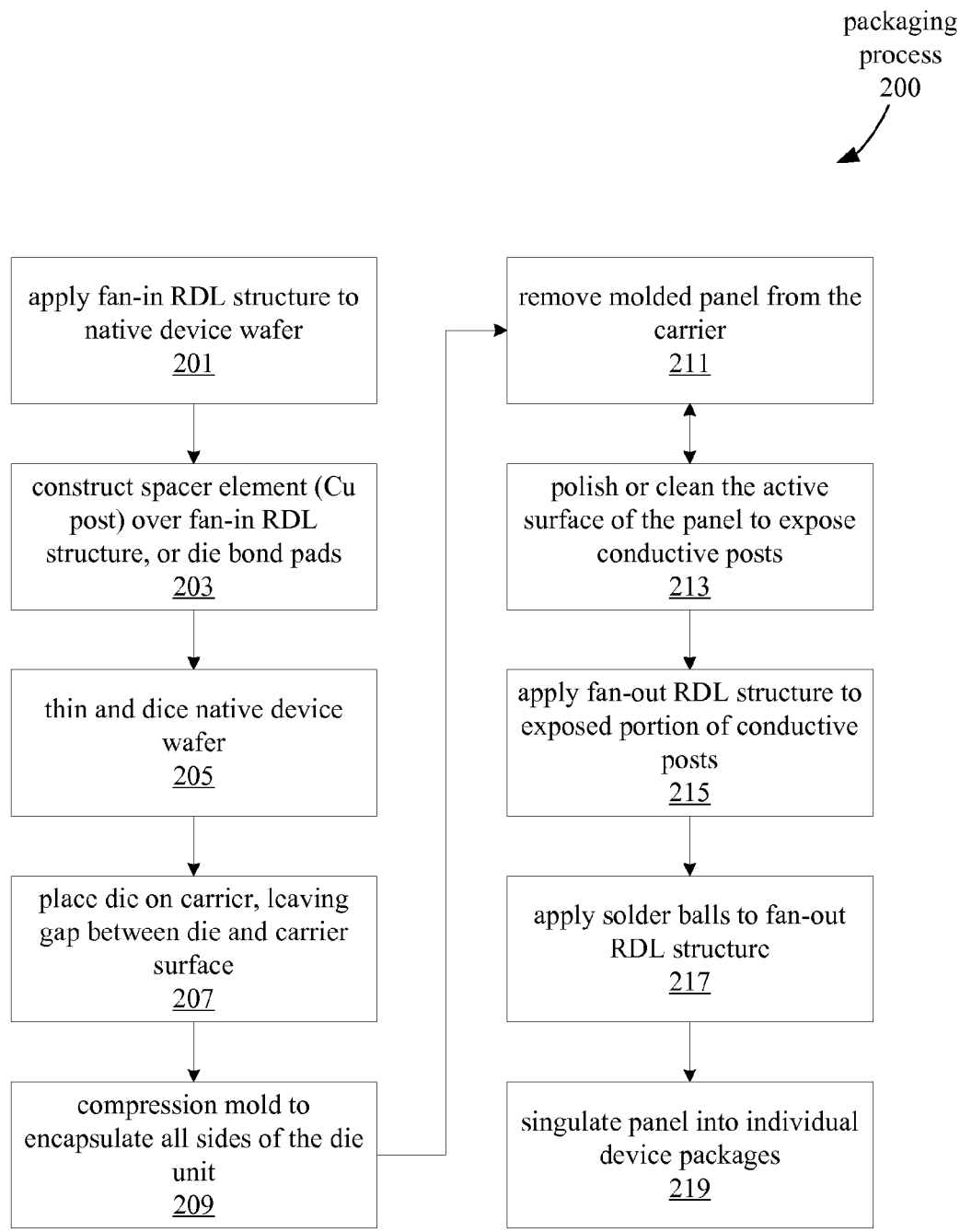
FIG. 2 is a flow diagram illustrating an embodiment of process for manufacturing a semiconductor package.

FIG. 2 illustrates a process for encapsulating a semiconductor die package in a mold compound to create a semiconductor chip package, according to an embodiment. In one embodiment, the packaging process 200 may be performed on a native device wafer, on which a number of semiconductor devices have been constructed.

Process 200 begins at block 201. At block 201, a fan in RDL structure may be applied to the native device wafer. For example, a fan-in RDL structure may be applied to the individual die units of the native device wafer.

Figure 3:
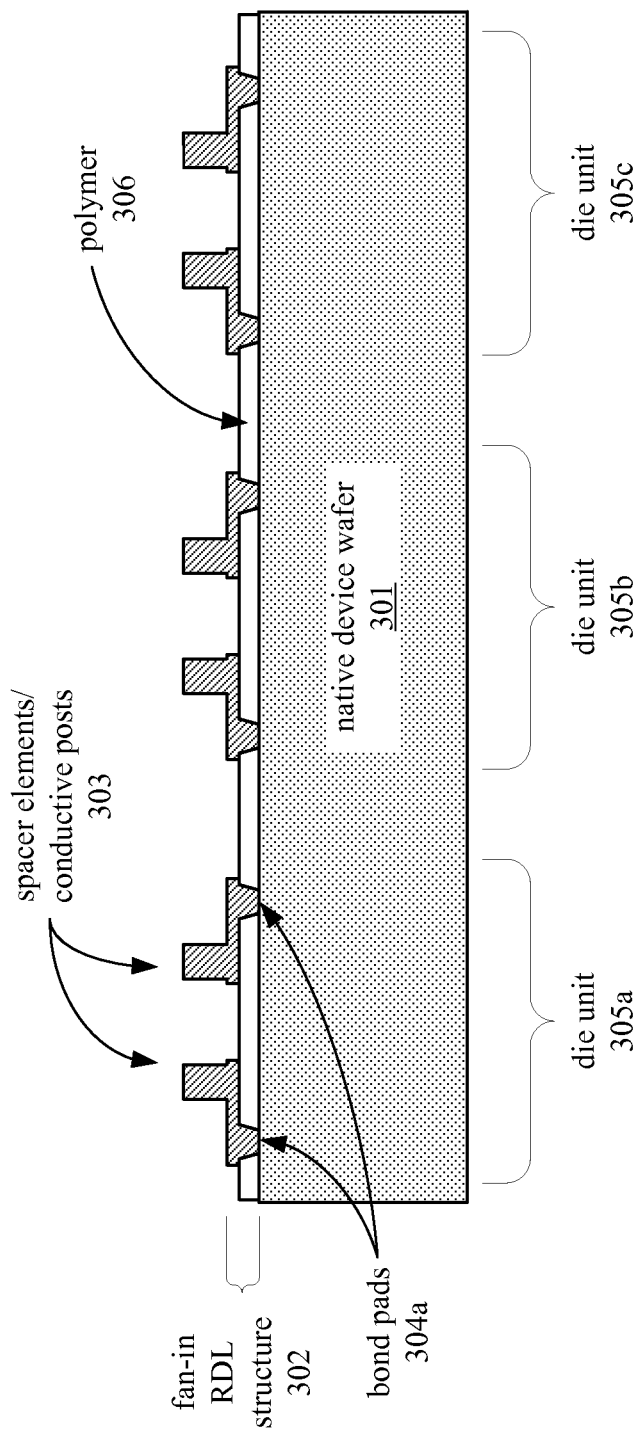
FIG. 3 illustrates an embodiment of a device wafer on which a fan-in RDL structure and conductive posts are constructed.

FIG. 3 illustrates an embodiment of a native device wafer 301, including multiple die units 305a, 305b, and 305c. The fan-in RDL 302 may be used to electrically couple the bond pads 304a of the die unit 305a to one or more conductive posts 303, to be plated onto the fan-in RDL 302. In one embodiment, the fan-in RDL structure may include multiple layers; alternatively, the structure may include a single layer. In one embodiment, the fan-in RDL structure may include a layer of polymer 306; alternatively, the polymer 306 may be omitted from certain embodiments. From block 201, the process 200 continues at block 203.

At block 203, one or more spacer elements 303 are constructed over any fan-in RDL structure 302 constructed according to block 201. Alternatively, if the fan-in RDL structure 302 is omitted, the spacer elements 303 may be constructed directly on the bond pads, such as bond pads 304a, of the semiconductor die units. In either case, the spacer elements may include conductive posts 303 that may be electrically connected to the bond pads of the die units 305, either directly, or through the fan-in RDL 302.

In one embodiment, the spacer elements 303 are designed to maintain a gap between the die unit and a surface of a carrier supporting the die unit. In one embodiment, the spacer elements 303 are conductive posts that are designed to connect the bond pads 304a of the die unit 305a to conductive material at an exterior surface of the semiconductor device package, when completed.

In one embodiment, the conductive posts 303 used as spacer elements and for electrically connecting to the bond pads are constructed by plating copper over the previously constructed fan-in RDL traces 302 to a height of at least 50 microns tall. From block 203, the process 200 continues at block 205.

Figure 4:
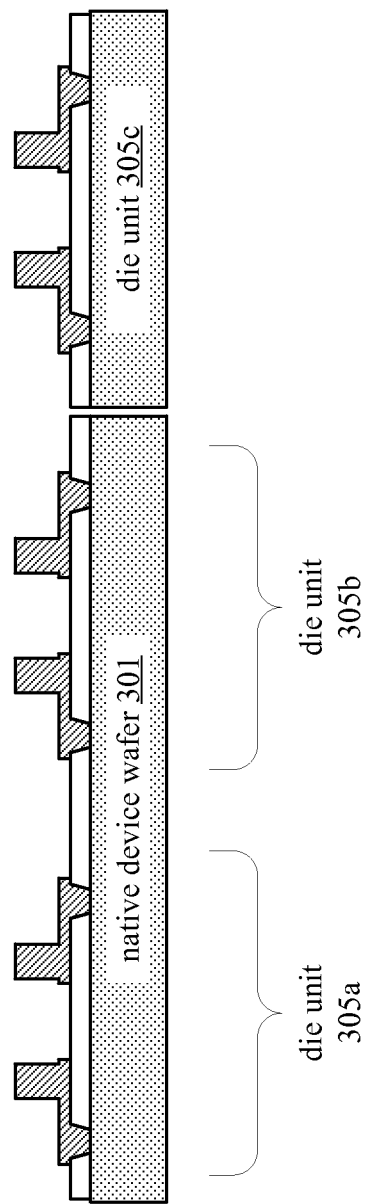
FIG. 4 illustrates an embodiment of a device wafer on which a fan-in RDL structure and conductive posts are constructed.

At block 205, the native device wafer is thinned and diced into individual die units prior to encapsulating in the mold compound. Thus, each of the die units is separated from each of the other device units making up the wafer. FIG. 4 illustrates the device wafer 301, according to an embodiment, which has been thinned to its final thickness, and die unit 305c, which has been separated from the other die units 305a and 305b. From block 205, the process 200 continues at block 207.

Figure 5:
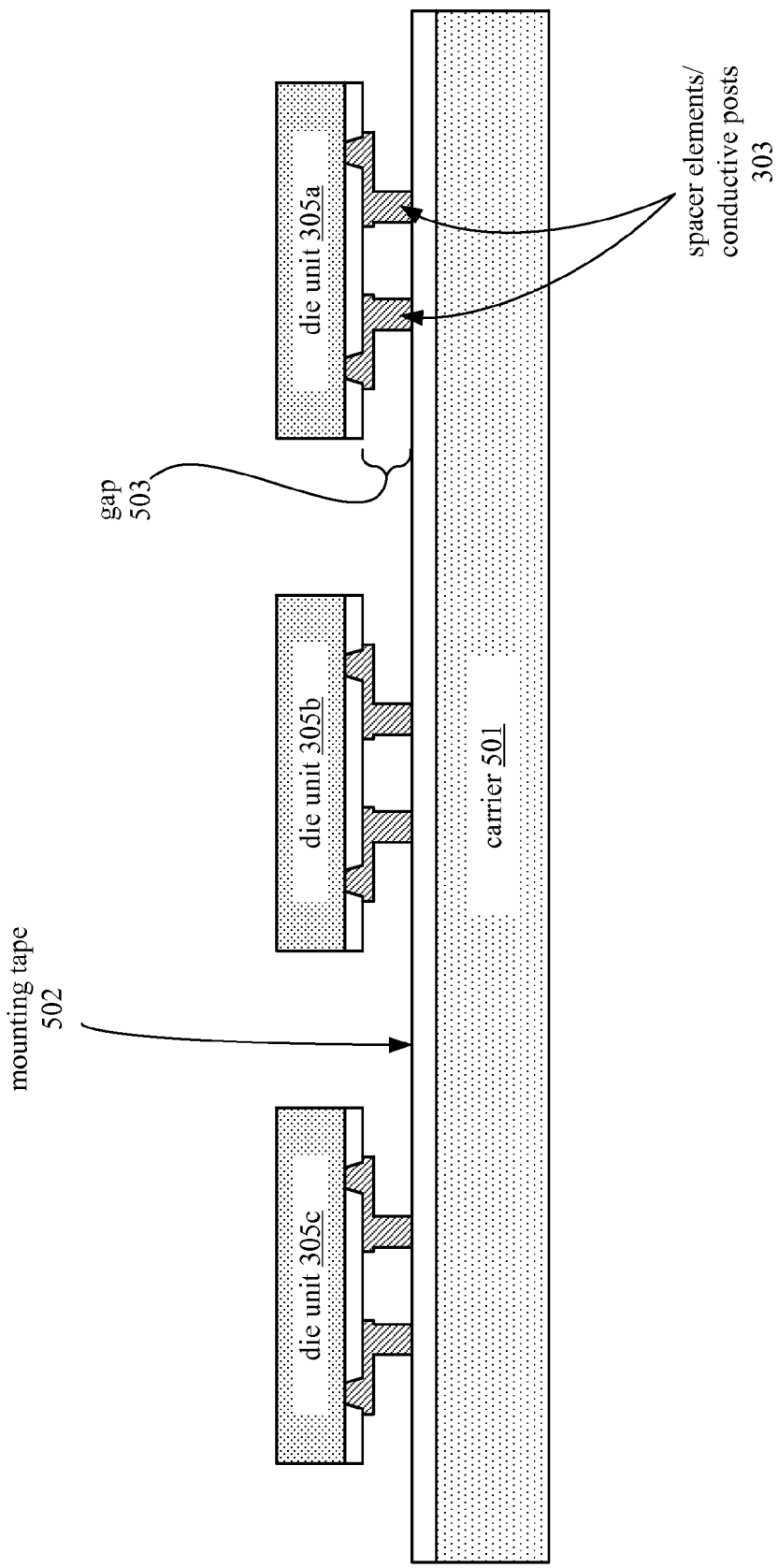
FIG. 5 illustrates die units mounted on a carrier element, according to an embodiment.

FIG. 5 illustrates die units 305c, 305b, and 305a as placed on a carrier 501, according to an embodiment. At block 207, the semiconductor die units 305c, 305b, and 305a may be placed with the active side down (with bond pads facing down) on a carrier 501 using a sacrificial double-sided mounting tape 502. In one embodiment, a previously constructed spacer element 303 may create a gap 503 that separates the semiconductor die unit 305a from the carrier 501 and mounting tape 502. In one embodiment, the spacer element 303 includes at least one conductive post that is electrically connected with at least one bond pad of the die unit 305a. From block 207, the process 200 continues at block 209.

Figure 6:
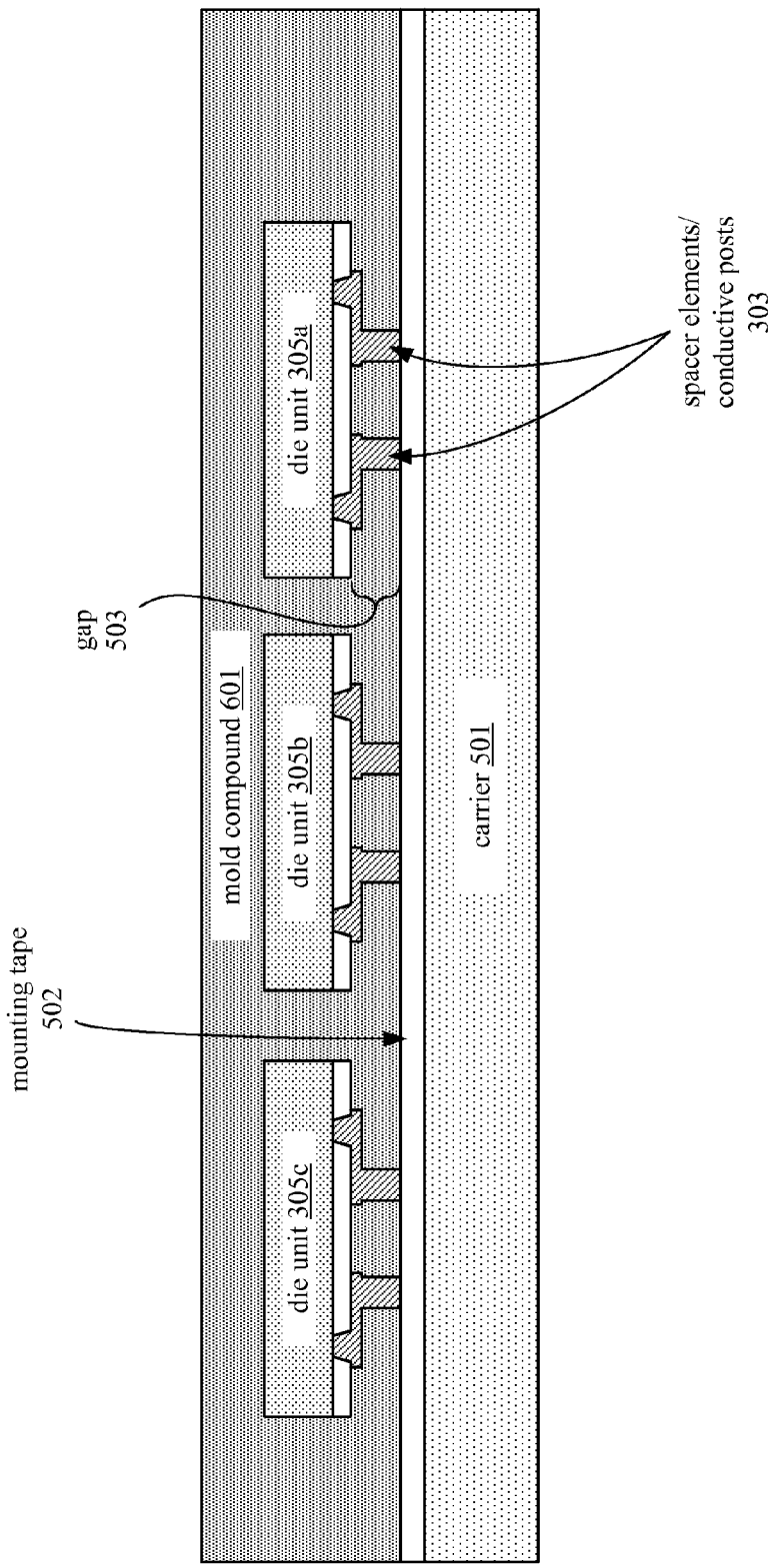
FIG. 6 illustrates die units encapsulated in mold compound, according to an embodiment.

FIG. 6 illustrates a carrier 501 on which die units 305c, 305b, and 350a are mounted, where the die units 305c-a are encapsulated by a mold compound 502, according to an embodiment. At block 209 of process 200, a molding process may be performed to encapsulate the die units within a mold compound 601. In one embodiment, the molding process is a compression molding process that causes the mold compound 601 to be introduced into the gap 503 created by the spacer element 303. In one embodiment, the die unit 305a is substantially encapsulated by the mold compound such that mold compound is present on every side of the die unit. In one embodiment, a single contiguous mass of the mold compound 601 may surround the die unit 305a.

In one embodiment, the mold compound 601 applied by the compression molding process may distribute the mold compound such that a thickness of the mold compound on the top of the semiconductor die unit 305a is less than three times the thickness of the mold compound present under the bottom, active side, of the die unit 305a. From block 209, the process 200 continues at block 211.

At block 211, the molded panel is removed from the carrier. From block 211, the process 200 continues at block 213. At block 213, material may be removed from the active surface of the molded panel to expose the conductive posts. For example, the molded panel may be cleaned or polished to expose the posts at the surface of the molded panel. This process may remove any mold compound that may have crept in between the conductive posts and the mounting tape. From block 213, the process continues at block 215.

Figure 7:
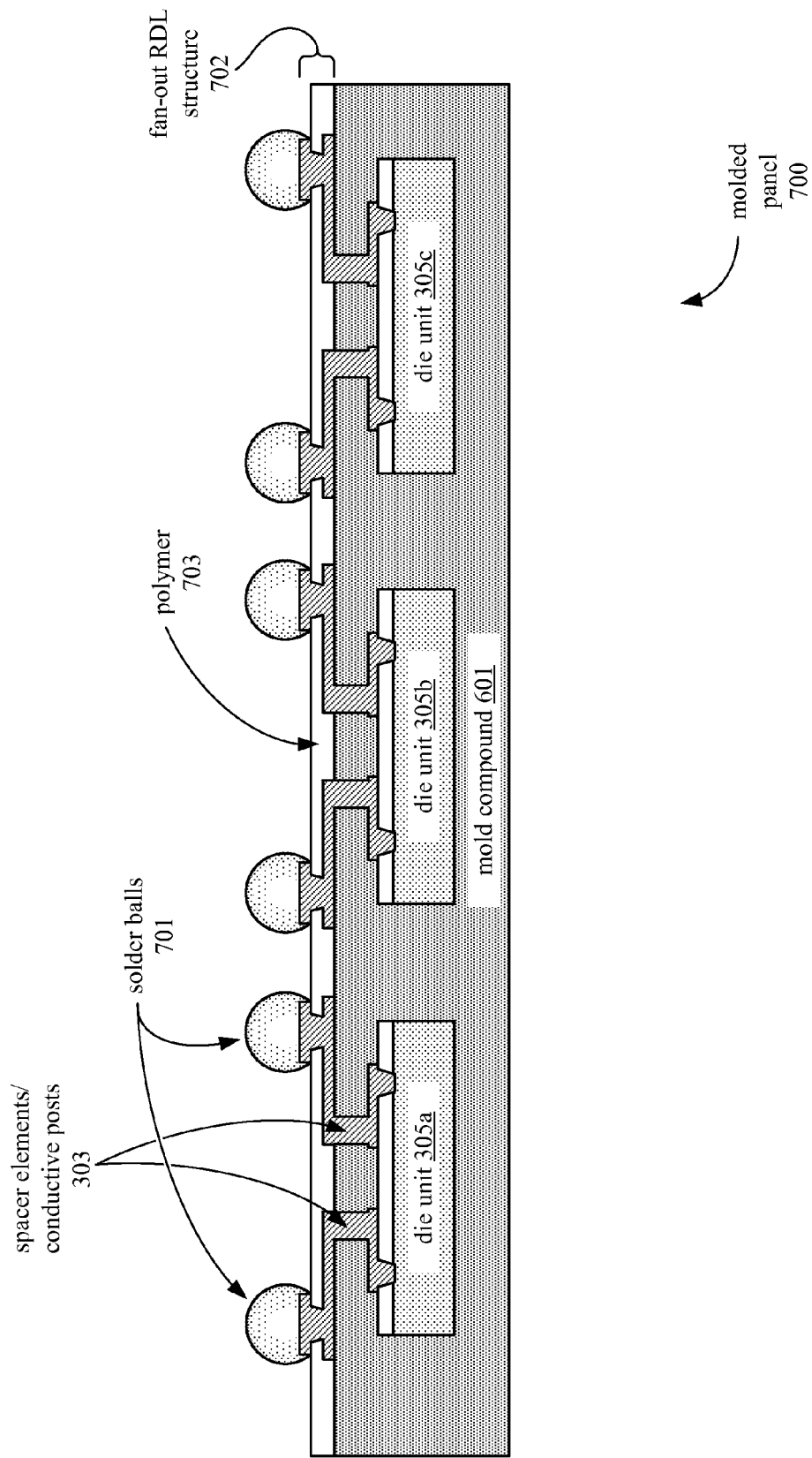
FIG. 7 illustrates die units encapsulated in mold compound and with solder balls applied, according to an embodiment.

FIG. 7 illustrates a molded panel 700 including die units 305a, 305b, and 305c with a fan-out RDL structure 702 and solder balls 701, according to an embodiment. At block 215, a fan-out redistribution layer (RDL) 702 may be constructed on the active surface of the molded panel 700, and may be electrically connected to the conductive posts 303 exposed at block 213. In one embodiment, the fan-out RDL structure 702 may include multiple layers; alternatively, the structure may include a single layer. In one embodiment, the fan-out RDL structure 702 may include a layer of polymer 703; alternatively, the polymer 703 may be omitted from certain embodiments. From block 215, the process 200 continues at block 217.

At block 217, solder balls 701 may be applied to the fan-out RDL structure 702. In an alternative embodiment where a fan-out RDL structure 702 may be omitted, the solder balls 701 may be applied directly to the conductive posts 303 exposed at block 213. Such application of solder balls 701 may be used when the device package being manufactured is a ball grid array (BGA) package. From block 217, the process 200 continues at block 219.

Figure 8:
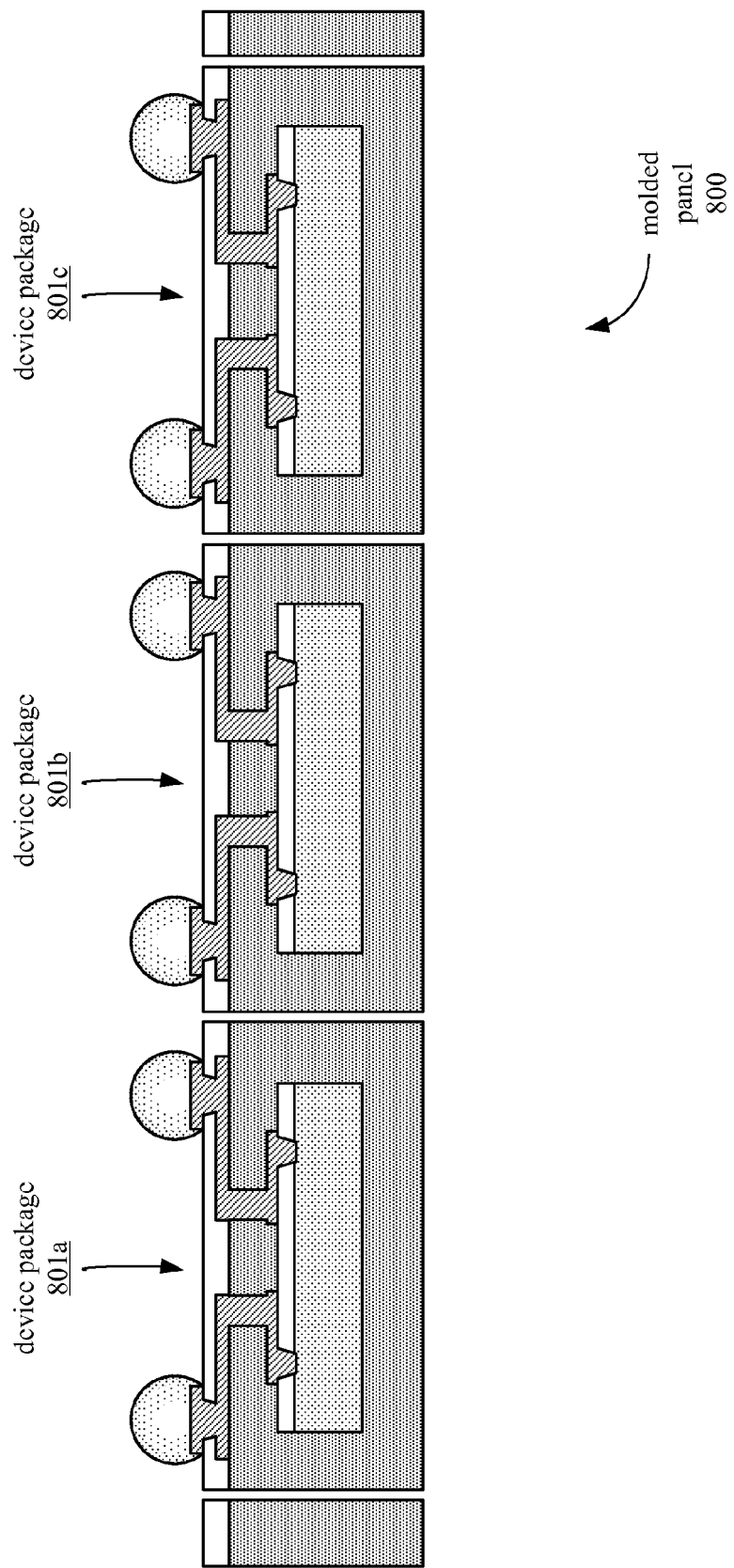
FIG. 8 illustrates singulated device packages, according to an embodiment.

At block 219, the molded panel may be singulated into individual device packages. FIG. 8 illustrates one embodiment of a molded panel 800 that has been singulated into multiple device packages 801a, 801b, and 801c, according to an embodiment. In one embodiment, a saw may be used to cut the molded panel, separating each of the encapsulated die units from each of the other encapsulated die units in the panel.

Figure 9:
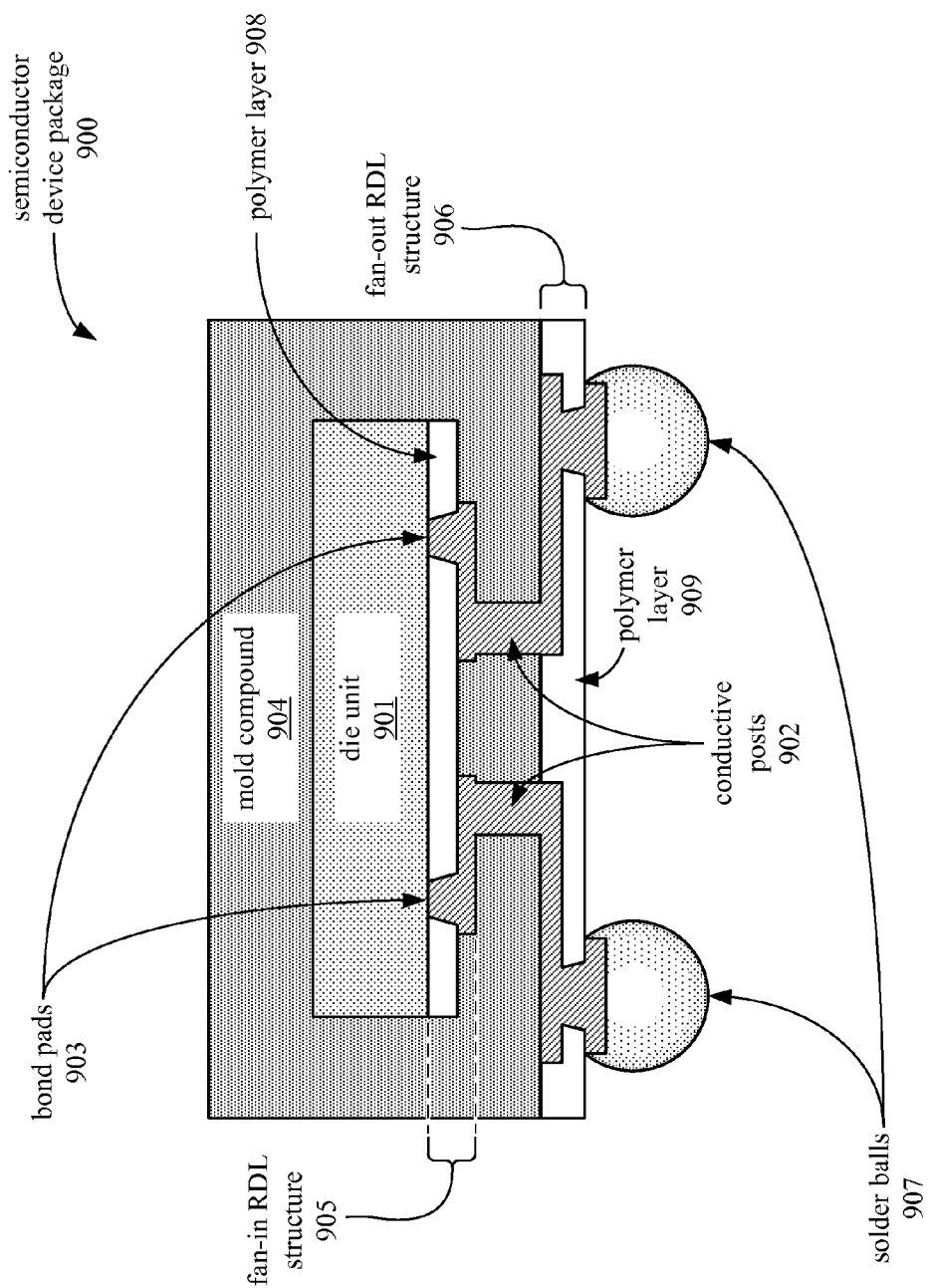
FIG. 9 illustrates an embodiment of a ball grid array (BGA) semiconductor device package.

FIG. 9 illustrates a semiconductor device package 900, according to an embodiment. In one embodiment, package 900 may be manufactured according to process 200, as illustrated in FIG. 2.

In one embodiment, the package 900 includes a semiconductor die unit 901 and a number of conductive posts 902 electrically coupled to bond pads 903 of the die unit 901. In one embodiment, the conductive posts 902 may be electrically connected to the bond pads 903 through a fan-in RDL structure 905, which may include a polymer layer 908 to support the traces of RDL structure 905.

The exterior of the package is formed from mold compound 904 that substantially surrounds all sides of the semiconductor die unit 901. In one embodiment, the conductive posts 902 are electrically coupled with conductive material exposed outside the mold compound 904. As illustrated in FIG. 9, the conductive material exposed at outside of the mold compound 904 may be solder balls 907, where the device package 900 is a BGA package.

In one embodiment, the conductive posts 902 may be electrically connected to the solder balls 907 through a fan-out RDL structure 906. In one embodiment, the fan-out RDL structure 906 may include a polymer layer 909 to support the conductive traces of the fan-out RDL structure 906 to which the conductive posts 902 and the solder balls 907 are connected.

Figure 10:
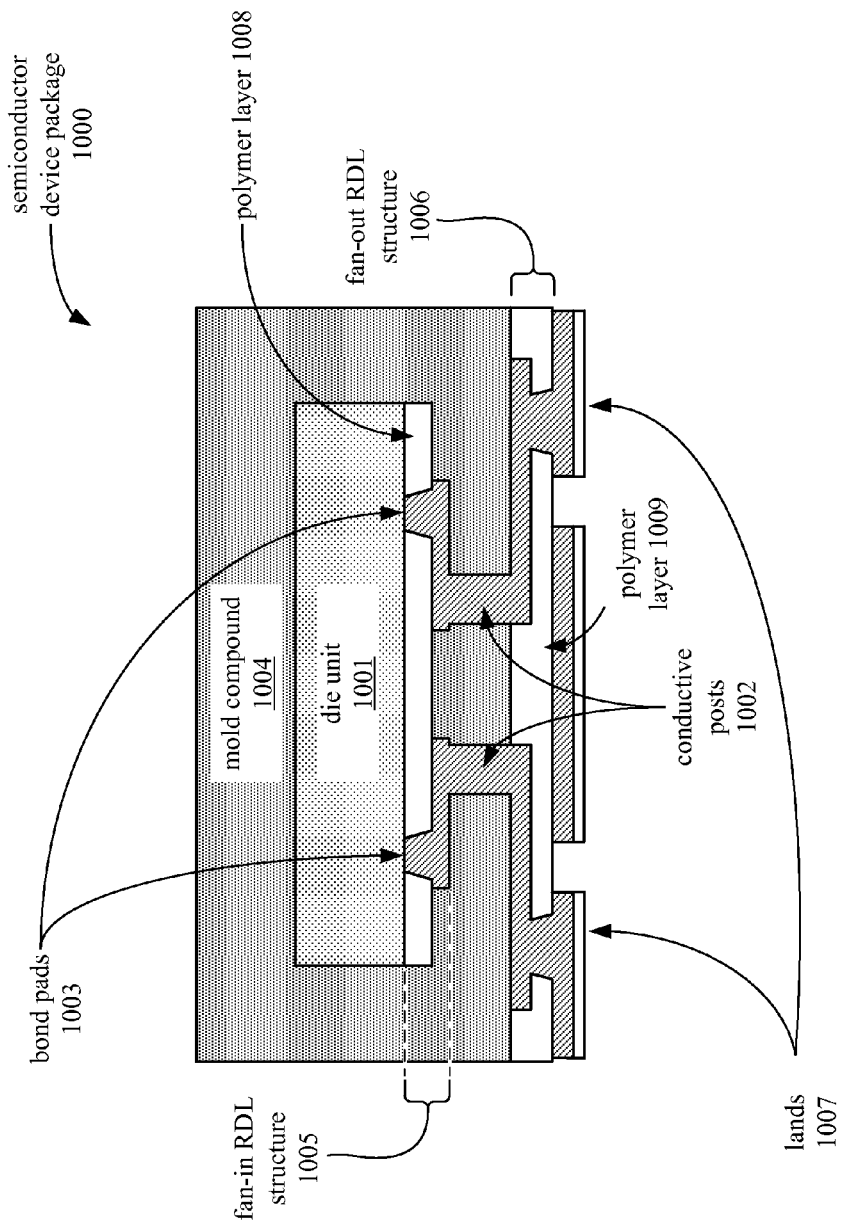
FIG. 10 illustrates an embodiment of a quad flat no-lead (QFN) semiconductor device package.

FIG. 10 illustrates an encapsulated quad flat no-lead (QFN) package 1000 having a land grid array, according to an embodiment. In one embodiment, the package 1000 includes a semiconductor die unit 1001 and a number of conductive posts 1002 electrically coupled to bond pads 1003 of the die unit 1001. In one embodiment, the conductive posts 1002 may be electrically connected to the bond pads 1003 through a fan-in RDL structure 1005, which may include a polymer layer 1008 to support the traces of RDL structure 1005.

The exterior of the package is formed from mold compound 1004 that substantially surrounds all sides of the semiconductor die unit 1001. In one embodiment, the conductive posts 1002 are electrically coupled with conductive material exposed at or outside a surface of the mold compound 1004. As illustrated in FIG. 10, the conductive material exposed outside the surface of the mold compound 1004 may be lands 1007 of the QFN device package 1000.

In one embodiment, the conductive posts 1002 may be electrically connected to the lands 1007 through a fan-out RDL structure 1006. In one embodiment, the fan-out RDL structure 1006 may include a polymer layer 1009 to support the conductive traces of the fan-out RDL structure 1006 to which the conductive posts 1002 and the lands 1007 are connected.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

The invention claimed is:

1. A semiconductor device package, comprising:
a semiconductor die unit;
a first redistribution layer (RDL) disposed over a surface of the semiconductor die unit and electrically coupled with one or more bond pads on an active first surface of the semiconductor die unit;
a plurality of conductive posts electrically coupled with the first redistribution layer; and
mold compound substantially covering the active surface and a side surface of the semiconductor die unit, wherein the plurality of conductive posts are electrically coupled by a second RDL to conductive material exposed outside the mold compound, and wherein the conductive posts are disposed between the first RDL and second RDL.

2. The semiconductor device package of claim 1, wherein the first RDL comprises a fan-in redistribution layer (RDL) connecting the one or more bond pads to the plurality of conductive posts.

3. The semiconductor device package of claim 1, wherein the semiconductor die unit comprises six sides and the mold compound surrounds all six sides of the semiconductor die unit.

4. The semiconductor device package of claim 1, further comprising:
a first portion of the mold compound disposed over the active first surface of the semiconductor die unit; and
a second portion of the mold compound disposed over a second surface of the semiconductor die unit opposite the active first surface of the semiconductor die unit, wherein a thickness of the second portion of mold compound is less than three times a thickness of the first portion of the mold compound.

5. The semiconductor device package of claim 1, wherein the second RDL is a build-up fan-out RDL structure and is electrically coupled with the plurality of conductive posts.

6. The semiconductor device package of claim 5, wherein the conductive material exposed outside the mold compound comprises a plurality of solder balls electrically coupled to the fan-out RDL structure, wherein the semiconductor device package is a ball-grid array (BGA) package.

7. The semiconductor device package of claim 5, wherein an entirety of the fan-out RDL structure is formed on the mold compound.

8. A semiconductor device package, comprising:
a semiconductor die unit;
a plurality of conductive posts electrically coupled with one or more bond pads on an active first surface of the semiconductor die unit; and
mold compound substantially covering the active first surface and a side surface of the semiconductor die unit, wherein the plurality of conductive posts are electrically coupled by a build-up redistribution layer (RDL) to conductive material exposed outside the mold compound.

9. The semiconductor device package of claim 8, further comprising a similar thickness of the mold compound disposed above and below the semiconductor die unit.

10. The semiconductor device package of claim 8, wherein the plurality of conductive posts comprise a height of at least 50 microns.

11. The semiconductor device package of claim 8, wherein the RDL is formed as a fan-out RDL disposed across a continuous portion of the mold compound that overlaps the semiconductor die unit without discontinuities.

12. The semiconductor device package of claim 11, further comprising a fan-in RDL structure formed on the semiconductor die unit.

13. The semiconductor device package of claim 8, wherein the mold compound is present on every side of the semiconductor die unit.

14. The semiconductor device package of claim 8, wherein the mold compound is formed as a single continuous mass surrounding the semiconductor die unit.

15. A semiconductor device package, comprising:
a semiconductor die unit;
a plurality of conductive posts electrically coupled with an active first surface of the semiconductor die unit; and
mold compound substantially covering the active first surface of the semiconductor die unit and a second surface of the semiconductor die unit opposite the active first surface, wherein the plurality of conductive posts are coupled by a first build-up redistribution layer (RDL) to conductive material exposed outside the mold compound.

16. The semiconductor device package of claim 15, wherein the conductive material exposed outside the mold compound comprises a plurality of lands coupled to the first RDL, wherein the semiconductor device package is a quad flat no-lead (QFN) package.

17. The semiconductor device package of claim 15, further comprising a similar thickness of the mold compound disposed above and below the semiconductor die unit.

18. The semiconductor device package of claim 15, wherein the plurality of conductive posts comprise a height of at least 50 microns.

19. The semiconductor device package of claim 15, further comprising a second build-up RDL formed as a fan-in RDL structure disposed on the semiconductor die unit.

20. The semiconductor device package of claim 15, wherein the mold compound is formed as a single continuous mass surrounding the semiconductor die unit.

* * * * *